(12) United States Patent
Chen et al.

(10) Patent No.: US 10,874,021 B2
(45) Date of Patent: Dec. 22, 2020

(54) MANUFACTURING METHOD FOR WIRING BOARD

(71) Applicant: DISCO CORPORATION, Tokyo (JP)

(72) Inventors: Ye Chen, Tokyo (JP); Frank Wei, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 471 days.

(21) Appl. No.: 15/727,843

(22) Filed: Oct. 9, 2017

(65) Prior Publication Data

US 2018/0103547 A1   Apr. 12, 2018

(30) Foreign Application Priority Data

Oct. 11, 2016  (JP) ................ 2016-200273

(51) Int. Cl.
*H05K 3/26* (2006.01)
*H05K 3/46* (2006.01)
(Continued)

(52) U.S. Cl.
CPC ............. *H05K 3/26* (2013.01); *B24B 37/042* (2013.01); *C25D 5/48* (2013.01); *C25D 7/123* (2013.01); *H01L 21/4857* (2013.01); *H01L 23/49822* (2013.01); *H01L 23/49838* (2013.01); *H01L 23/562* (2013.01); *H05K 3/045* (2013.01); *H05K 3/107* (2013.01); *H05K 3/465* (2013.01); *H05K 3/0044* (2013.01); *H05K 2203/025* (2013.01);
(Continued)

(58) Field of Classification Search
CPC .......... H05K 3/26; H05K 3/045; H05K 3/107; H05K 3/465; H05K 3/0044; H05K 2203/025; H05K 2203/0346; H01L 21/4857; H01L 23/49822; H01L 23/49838; H01L 23/562; C25D 5/48; C25D 7/123; Y10T 29/49155; Y10T 29/49124; Y10T 29/49117; Y10T 29/49002
USPC ............ 29/846, 829, 825, 592.1, 832
See application file for complete search history.

(56) References Cited

U.S. PATENT DOCUMENTS

| 6,245,676 B1 * | 6/2001 | Ueno | ............. C25D 5/18 205/103 |
| 2005/0196956 A1 * | 9/2005 | Fischer | ......... H01L 21/76865 438/631 |

(Continued)

FOREIGN PATENT DOCUMENTS

| JP | 2001-196743 | 7/2001 |
| JP | 2013-080823 | 5/2013 |

*Primary Examiner* — Peter Dungba Vo
*Assistant Examiner* — Azm A Parvez
(74) *Attorney, Agent, or Firm* — Greer Burns & Crain Ltd.

(57) ABSTRACT

A method for manufacturing a wiring board that has a rewiring layer on a surface thereof includes forming an insulating layer on a core substrate, forming a groove, in which a wiring layer of a circuit pattern is to be provided, on the insulating layer, forming a metal seed layer on an exposed face of the insulating layer on which the groove is formed, electrodepositing metal, which is to form the wiring layer, by plating to fill the groove with the metal to form a metal layer on the seed layer, machining the metal layer by a cutting tool to remove the metal layer up to a position not reaching the top of the insulating layer, and performing etching or a CMP process to expose the top of the insulating layer thereby to form the wiring layer in the groove and flatten an exposed face of the wiring layer.

2 Claims, 9 Drawing Sheets

(51) Int. Cl.
*H05K 3/04* (2006.01)
*B24B 37/04* (2012.01)
*C25D 5/48* (2006.01)
*C25D 7/12* (2006.01)
*H01L 21/48* (2006.01)
*H01L 23/498* (2006.01)
*H01L 23/00* (2006.01)
*H05K 3/10* (2006.01)
*H05K 3/00* (2006.01)

(52) U.S. Cl.
CPC . *H05K 2203/0346* (2013.01); *Y10T 29/49155* (2015.01)

(56) References Cited

U.S. PATENT DOCUMENTS

2009/0280649 A1* 11/2009 Mayer .................. H01L 21/3212
438/676
2013/0048342 A1* 2/2013 Malstrom .............. H05K 3/043
174/250
2016/0343654 A1* 11/2016 Kojima .................. H01L 29/34

* cited by examiner

MANUFACTURING METHOD FOR WIRING BOARD

BACKGROUND OF THE INVENTION

Field of the Invention

The present invention relates to a manufacturing method for a wiring board.

Description of the Related Art

Conventionally, a technology is known which relates to a wiring board such as an interposer or a printed wiring board in which semiconductor chips or various electric parts are mounted and incorporated such that continuity between electrodes of them and other parts is secured. The wiring board has a rewiring layer. For example, in Japanese Patent Laid-Open No. 2001-196743, a printed wiring board of the build-up type is disclosed in which conductor layers and organic insulating layers are alternately stacked on front and rear faces of a core substrate.

Japanese Patent Laid-Open No. 2013-80823 discloses a printed wiring board that is manufactured by providing a first insulating layer, which includes a reinforcing material impregnated with resin, on each of the opposite faces of a core substrate containing reinforcing material to reinforce the core substrate with the first insulating layers and then stacking a plurality of second insulating layers containing no reinforcing material on the first insulating layers. This printed wiring board suppresses warpage from being caused by a thermal history applied to the printed wiring board by configuring the core substrate and the first insulating layer so as to contain reinforcing material or by forming the first insulating layer greater in thickness than the second insulating layers.

SUMMARY OF THE INVENTION

In regard to semiconductor chips and various electric parts that are mounted on any of the wiring boards disclosed in Japanese Patent Laid-Open Nos. 2001-196743 and 2013-80823, reduction in weight and size is progressing and electrode pads connected to electrodes of the wiring board are reduced in size. Therefore, if the wiring board is warped or is not flat, then it is difficult to favorably connect electrodes of semiconductor chips or various electric parts to be mounted and electrodes of the wiring boards to each other, which makes a factor of a malfunction. Although the printed wiring board disclosed in Japanese Patent Laid-Open No. 2013-80823 suppresses occurrence of warpage when a thermal history is applied to the printed wiring board as described above, only such suppression of deformation by a thermal history results in failure to form the wiring board flat when the core substrate originally has a warped shape or is not flat. It seems a promising idea to machine the surface of an insulating layer, on which a circuit pattern is exposed, together with the circuit pattern in order to form the wiring board flat. However, depending upon a component of material contained in the insulating layer, there is the possibility that the machining of both the insulating layer and metal that forms the circuit pattern may give rise to roughness (smear) on the exposed face (machined face) of the circuit pattern, resulting in failure to form the circuit pattern in accordance with its design.

Therefore, it is an object of the present invention to suppress occurrence of roughness on a circuit pattern of a wiring board thereby to allow the circuit pattern to be formed in accordance with its design.

In accordance with an aspect of the present invention, there is provided a manufacturing method for a wiring board that includes a rewiring layer on a surface thereof, including an insulating layer forming step of forming an insulating layer on a core substrate, a groove forming step of forming a groove in which a wiring layer of a circuit pattern is to be provided on the insulating layer, a seed layer forming step of forming a metal seed layer on an exposed face of the insulating layer on which the groove is formed in the groove forming step, a metal layer forming step of electrodepositing metal, which is to form the wiring layer, by a plating process to fill the groove with the metal to form a metal layer on the seed layer, a first removing step of machining the metal layer by a cutting tool to remove the metal layer up to a position not reaching a top of the insulating layer, and a second removing step of performing, after the first removing step, etching or a chemical mechanical polishing process to expose the top of the insulating layer thereby to form the wiring layer in the groove and flatten an exposed face of the wiring layer.

In accordance with another aspect of the present invention, there is provided a manufacturing method for a wiring board that includes a rewiring layer on a surface thereof, including an insulating layer forming step of forming an insulating layer on a core substrate, a groove forming step of forming a groove in which a wiring layer of a circuit pattern is to be provided on the insulating layer, a seed layer forming step of forming a metal seed layer on an exposed face of the insulating layer on which the groove is formed in the groove forming step, a metal layer forming step of electrodepositing metal, which is to form the wiring layer, by a plating process to fill the groove with the metal to form a metal layer on the seed layer, a first removing step of machining the metal layer by a cutting tool to remove the metal layer up to a top of the insulating layer to form the wiring layer in the groove, and a second removing step of performing, after the first removing step, etching or a chemical mechanical polishing process to flatten an exposed face of the wiring layer.

Preferably, circuit patterns are formed on a front face side and a rear face side of the core substrate by any of the methods described above.

Preferably, after the second removing step, the insulating layer forming step of forming an insulating layer on the flattened wiring layer, the groove forming step, the seed layer forming step, the metal layer forming step, the first removing step, and the second removing step are repeated to stack circuit patterns.

The manufacturing methods for a wiring board according to the present invention exhibit an advantageous effect that roughness can be suppressed from occurring on a circuit pattern of a wiring board and the circuit pattern can be formed in accordance with a design therefor.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes for carrying out the present invention (embodiments) are described in detail with reference to the drawings. The present invention is not limited by the substance described below in connection with the embodiments. Further, constituent elements described below include elements easily conceivable by a person skilled in the art and elements substantially equivalent to them. Further, the constituent elements described below can be combined suitably. Furthermore, various omissions, substitutions and changes of the constituent elements may be made without departing from the subject matter of the present invention.

First Embodiment

Figure 1:
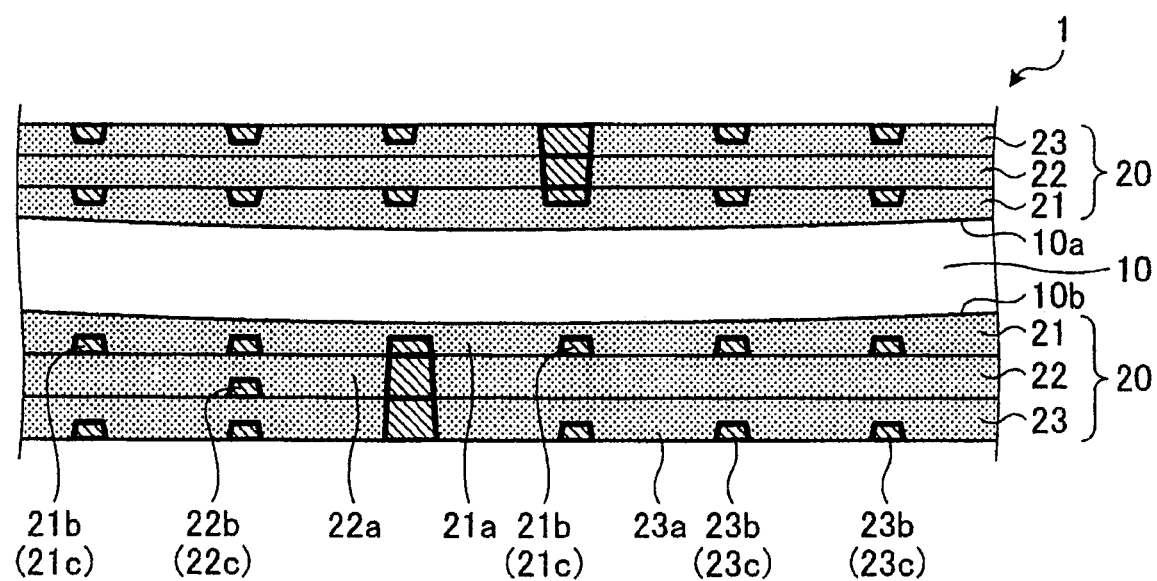
FIG. 1 is a cross sectional view depicting a wiring board manufactured by a manufacturing method for a wiring board according to a first embodiment.

A manufacturing method for a wiring board according to a first embodiment of the present invention is described with reference to the accompanying drawings. FIG. 1 is a cross sectional view depicting a wiring board manufactured by the manufacturing method for a wiring board according to the first embodiment. The wiring board 1 depicted in FIG. 1 includes a rewiring layer. The wiring board 1 is an interposer, a printed wiring board or the like in which semiconductor chips or various electric parts are mounted and incorporated and continuity between their electrodes and other parts is secured. In the present embodiment, the wiring board 1 is an interposer that has semiconductor chips mounted thereon and is connected to a printed wiring board such that electrodes of the semiconductor chips and a wiring pattern of the printed wiring board are connected to each other in accordance with a predetermined pattern. As illustrated in FIG. 1, the wiring board 1 includes a core substrate 10 serving as a core and a circuit pattern layer 20 serving as a rewiring layer formed on both a front face 10a and a rear face 10b of the core substrate 10.

The core substrate 10 is a substrate having an insulating (non-conductive) property formed, for example, from glass epoxy resin, ceramics, glass or the like. The thickness of the core substrate 10 is, for example, approximately 50 μm. In the present embodiment, as illustrated in FIG. 1, the core substrate 10 has a shape curved convexly to the rear face 10b side (to the lower side in FIG. 1). In the figures including FIG. 1, in order to indicate that the core substrate 10 is curved, the curvature degree is depicted in an exaggerated manner from an actual curvature degree of the core substrate 10.

Each of the circuit pattern layers 20 has a first circuit pattern layer 21 formed on the front face 10a or the rear face 10b of the core substrate 10, a second circuit pattern layer 22 formed on the first circuit pattern layer 21, and a third circuit pattern layer 23 formed on the second circuit pattern layer 22. It is to be noted that each circuit pattern layer 20 may include at least one layer and may include four or more layers on the core substrate 10.

The first circuit pattern layer 21 includes an insulating layer 21a having an insulating property and a wiring layer 21c that configures a plurality of circuit patterns 21b as electrode circuits embedded in the insulating layer 21a. The second circuit pattern layer 22 includes an insulating layer 22a having an insulating property and a wiring layer 22c that configures a plurality of circuit patterns 22b as electrode circuits embedded in the insulating layer 22a. The third circuit pattern layer 23 includes an insulating layer 23a having an insulating property and a wiring layer 23c that configures a plurality of circuit patterns 23b as electrode circuits embedded in the insulating layer 23a.

The insulating layers 21a, 22a, and 23a are interlayer insulating members of the dry film type containing resin material and are formed using Ajinomoto Build-up Film (hereinafter, referred to as "ABF") manufactured by Ajinomoto Fine-Techno Co., Inc. The ABF contains silica filler. Although, in the present embodiment, the insulating layers 21a, 22a and 23a are configured from the ABF, the material for configuring the insulating layers 21a, 22a and 23a is not limited to the ABF. Each of the insulating layers 21a, 22a and 23a isolates adjacent ones of the circuit patterns 21b, 22b and 23b from each other within each of the circuit pattern layers 20 and isolates adjacent ones of the circuit patterns 21b, 22b and 23b of the different circuit pattern layers 20 from each other. The thickness of the insulating layers 21a, 22a and 23a is, for example, approximately 40 μm.

The circuit patterns 21b, 22b and 23b are formed using a metal such as copper. The height of the circuit patterns 21b, 22b and 23b (height in the stacking direction of the circuit pattern layer 20) is, for example, approximately 15 to 20 μm. The circuit patterns 23b of each third circuit pattern layer 23 located in the outermost layer are exposed to the outer side of the wiring board 1. The circuit patterns 23b exposed to the outer sides of the wiring board 1 are connected to electrodes of semiconductor chips or wiring patterns of printed wiring boards. The wiring board 1 includes through electrodes extending through the core substrate 10 from the front face 10a to the rear face 10b to connect the circuit pattern layers 20 to each other. In the wiring board 1, the circuit patterns 23b exposed to the outer sides of the wiring board 1 are connected to electrodes of semiconductor chips or wiring patterns of printed wiring boards. Besides, the circuit patterns 21b, 22b and 23b of the circuit pattern layers 20 are electrically connected at predetermined locations to each other to electrically connect the electrodes of the semiconductor chips and the wiring patterns of the printed wiring boards to each other in accordance with a predetermined pattern.

Figure 2:
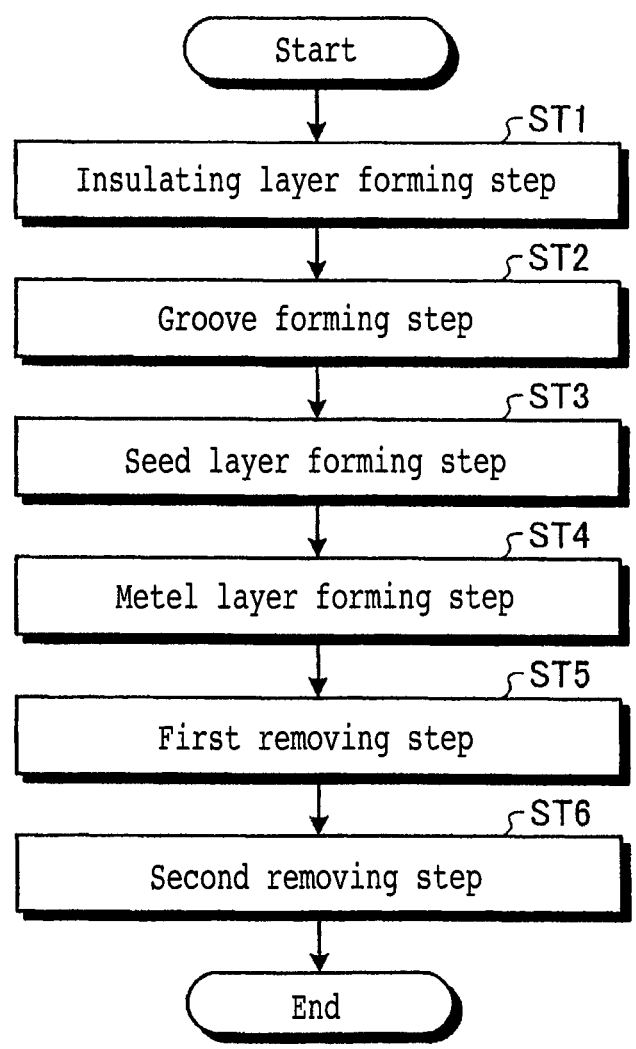
FIG. 2 is a flowchart illustrating a processing procedure for forming circuit pattern layers as part of a flow of the manufacturing method for a wiring board according to the first embodiment.

Subsequently, a method for manufacturing a wiring board according to the first embodiment is described. FIG. 2 is a flowchart depicting a processing procedure for forming circuit pattern layers as part of a flow of the manufacturing method for a wiring board according to the first embodiment. As illustrated in FIG. 2, the manufacturing method for a wiring board according to the first embodiment includes an insulating layer forming step ST1, a groove forming step ST2, a seed layer forming step ST3, a metal layer forming step ST4, a first removing step ST5, and a second removing step ST6. The processes illustrated in FIG. 2 are repeatedly carried out to form the wiring board 1 by stacking the first circuit pattern layers 21, second circuit pattern layers 22 and third circuit pattern layers 23. In the following, a forming procedure of the circuit pattern layers is described with reference to the drawings taking a case in which the first circuit pattern layers 21 are formed on the core substrate 10 as an example.

Figure 3:
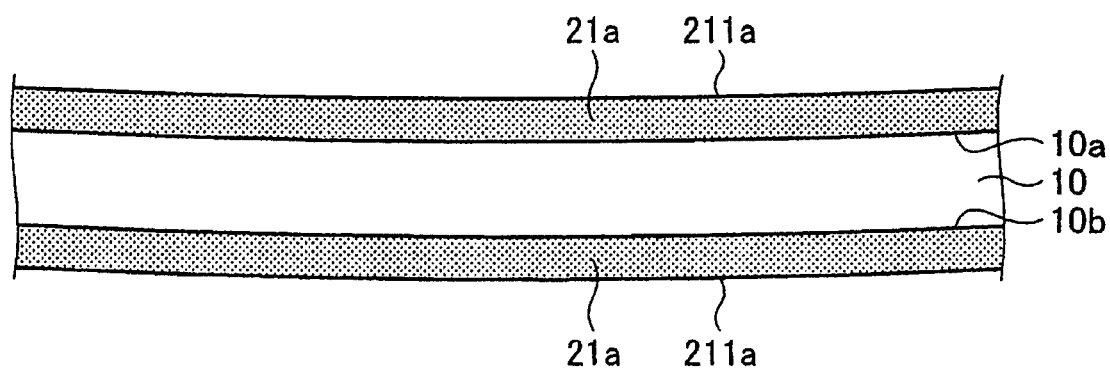
FIG. 3 is a schematic view depicting a core substrate on which an insulating layer is formed by an insulating layer forming step.
Figure 4:
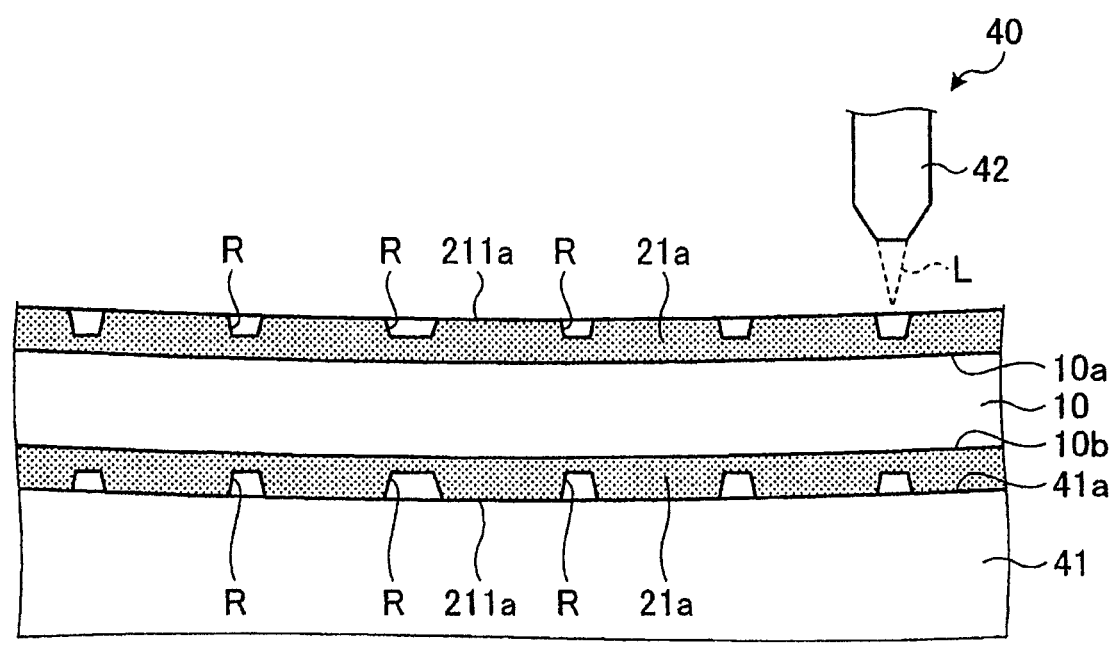
FIG. 4 is a schematic view illustrating a manner in which a plurality of grooves are formed on an exposed face of the insulating layer by a groove forming step.
Figure 5:
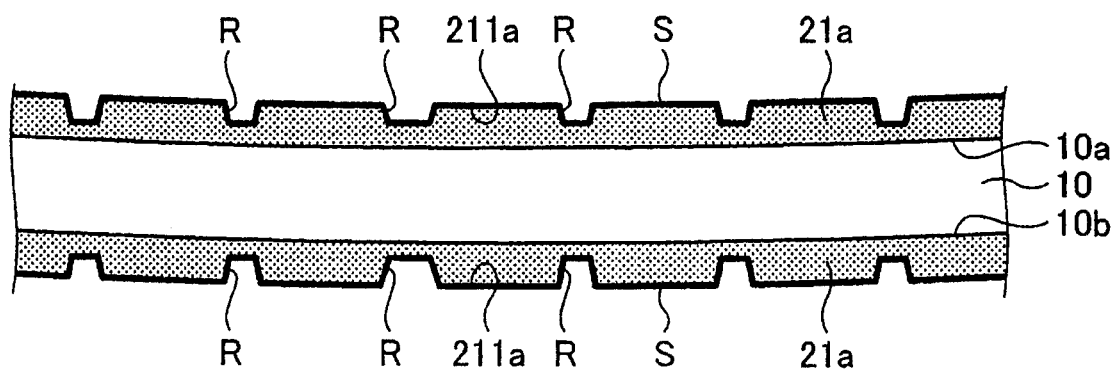
FIG. 5 is a schematic view depicting the core substrate in which a metal seed layer is formed on the surface of the insulating layer by a seed layer forming step.
Figure 6:
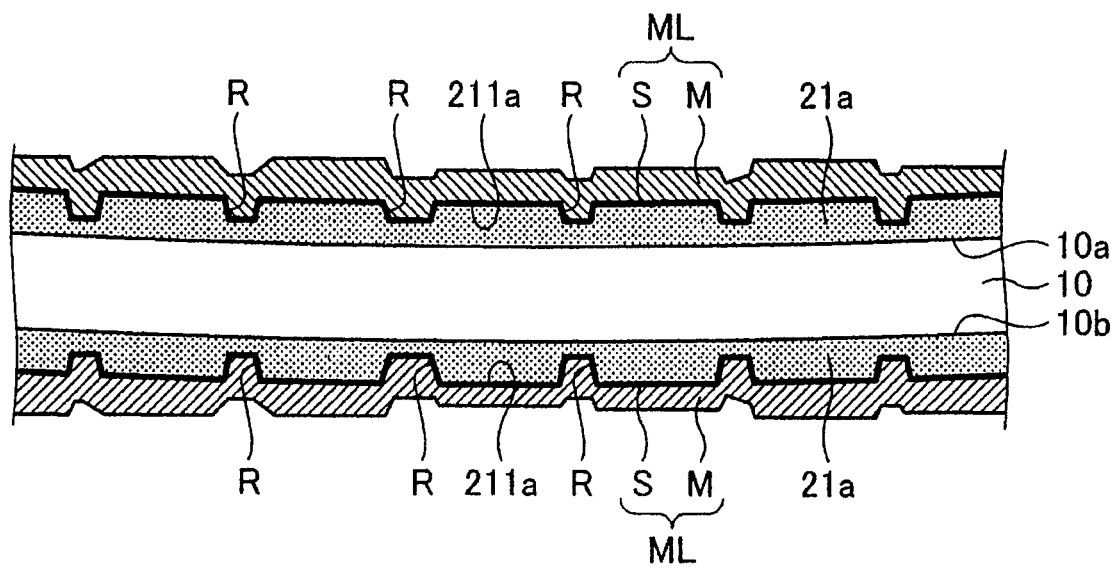
FIG. 6 is a schematic view depicting the core substrate on which metal is coated on the insulating layer by a metal layer forming step.
Figure 7:
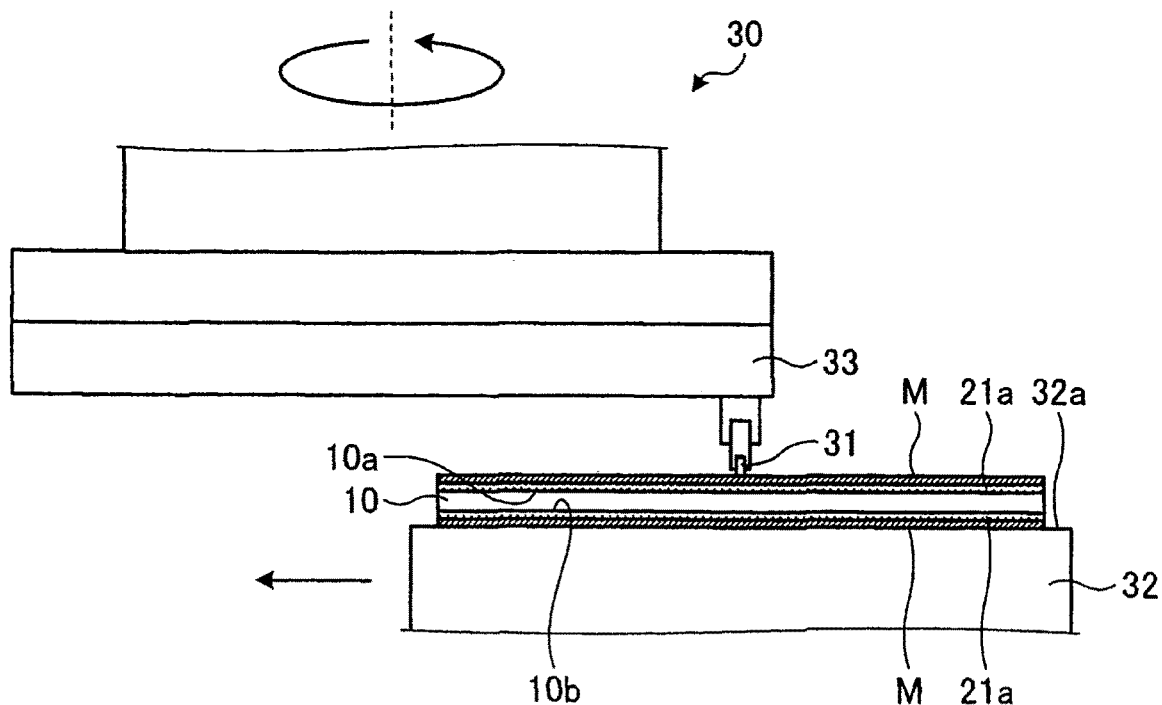
FIG. 7 is a schematic view illustrating a manner in which a first removing step is carried out.
Figure 8:
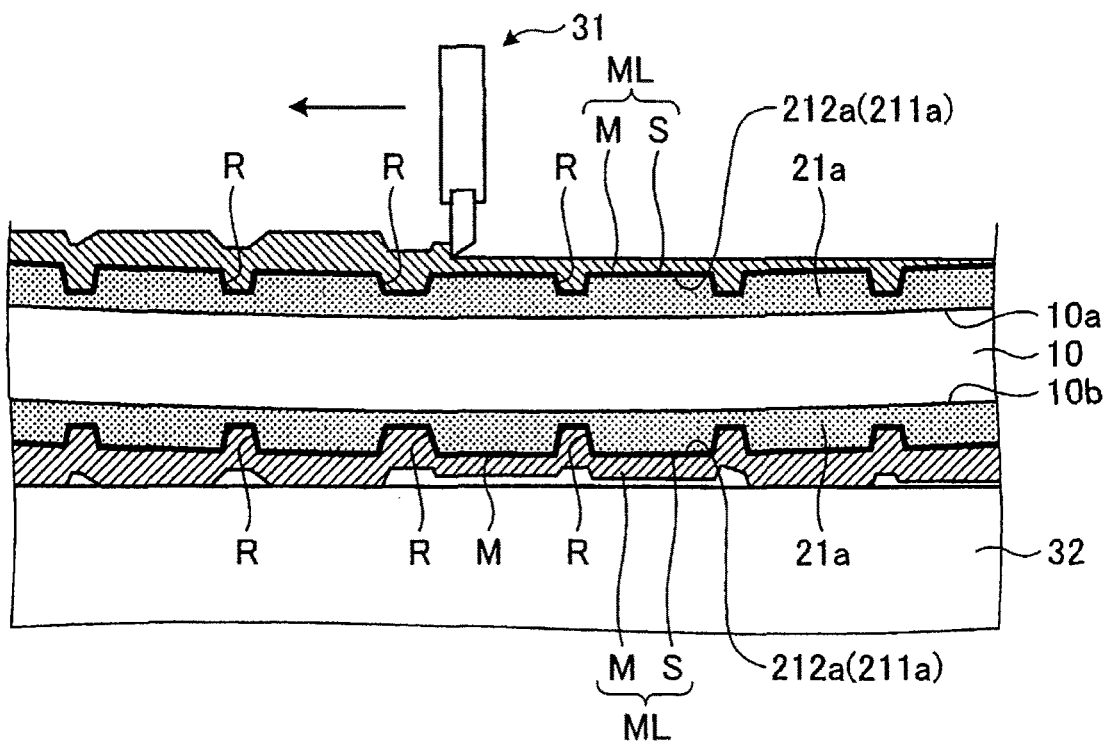
FIG. 8 is a schematic view depicting associated portions when the first removing step is carried out.
Figure 9:
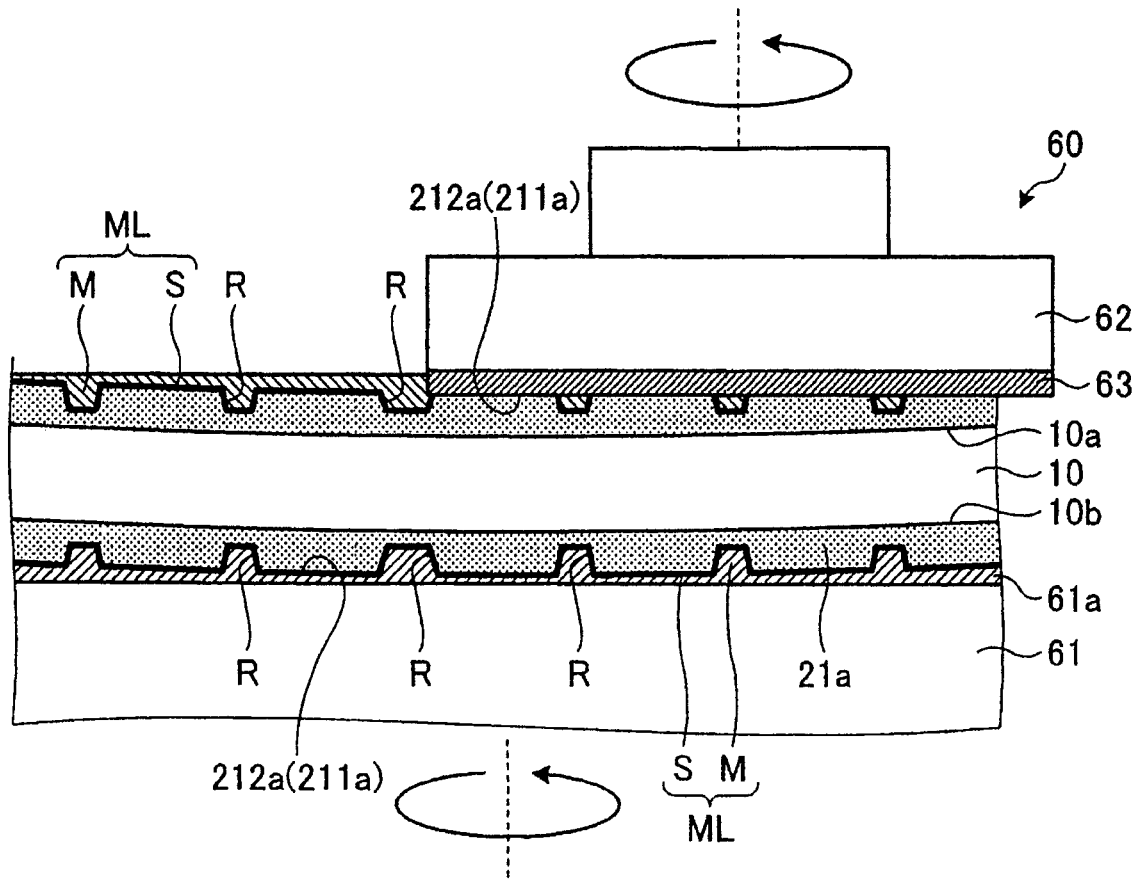
FIG. 9 is a schematic view illustrating a manner in which a second removing step is carried out.
Figure 10:
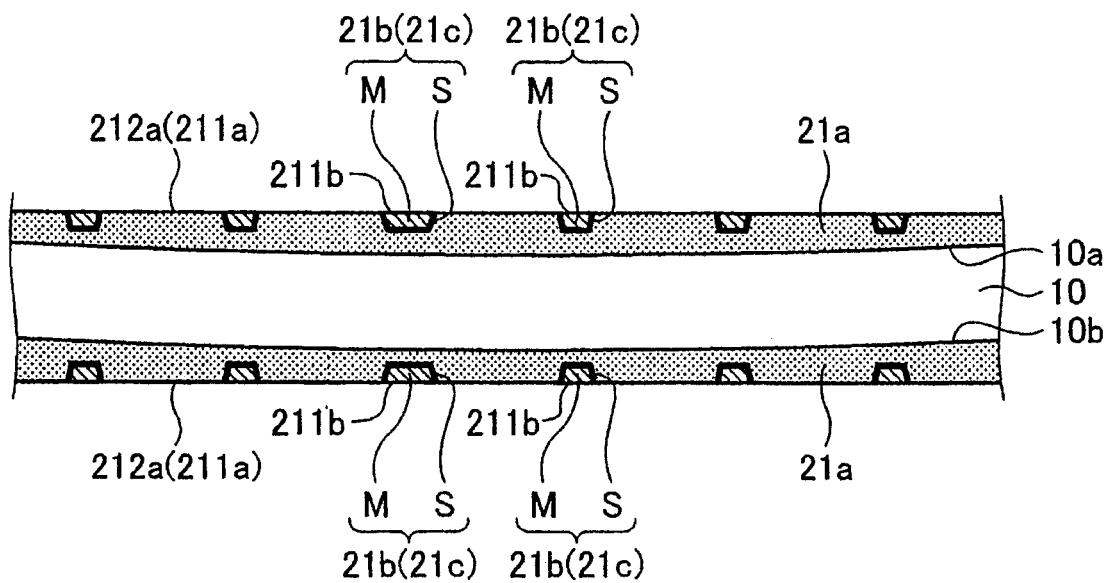
FIG. 10 is a schematic view depicting the core substrate on which a first circuit pattern layer is formed.

FIG. 3 is a schematic view depicting a core substrate 10 on which insulating layers 21a are formed by the insulating layer forming step ST1. FIG. 4 is a schematic view illustrating a manner in which a plurality of grooves R are formed on the surface of each of the insulating layers 21a by the groove forming step ST2. FIG. 5 is a schematic view depicting the core substrate 10 on which a metal seed layer S is formed on the surface of each of the insulating layers 21a by the seed layer forming step ST3. FIG. 6 is a schematic view depicting the core substrate 10 on which metal M is coated on each of the insulating layers 21a by the metal layer forming step ST4. FIG. 7 is a schematic view illustrating a manner in which a first removing step ST5 is performed. FIG. 8 is a schematic view depicting associated portions when the first removing step ST5 is performed. FIG. 9 is a schematic view illustrating a manner in which a second removing step ST6 is performed. FIG. 10 is a schematic view depicting the core substrate 10 on which the first circuit pattern layers 21 are formed.

The insulating layer forming step ST1 is a step of forming the insulating layers 21a on the front face 10a and the rear face 10b of the core substrate 10. In the insulating layer forming step ST1, as illustrated in FIG. 3, the ABF manufactured by Ajinomoto Fine-Techno Co., Inc. is fixed to both the front face 10a and the rear face 10b of a core substrate 10 by thermal press fitting or the like. Thereupon, since the core substrate 10 in the present embodiment is curved in a convex shape to the rear face 10b side (to the lower side in FIG. 3), also the surfaces 211a of the insulating layers 21a on the opposite faces from the core substrate 10, which are fixed to the front face 10a and the rear face 10b of the core substrate 10, are curved in accordance with the shape of the core substrate 10 as illustrated in FIG. 3.

After the insulating layer forming step ST1 when the first circuit pattern layers 21 are formed is performed, in order to form through electrodes not depicted in the wiring board 1, ablation processing in which a laser beam is used is performed for the core substrate 10 and the insulating layers 21a to form through-holes not depicted such that they extend through the core substrate 10 itself and both of the insulating layers 21a on the front face 10a side and the rear face 10b side of the core substrate 10. It is to be noted that this ablation processing may otherwise be performed in the groove forming step ST2 described below.

The groove forming step ST2 is a step of forming the grooves R, in which the wiring layers 21c are to be provided, on the insulating layers 21a using a laser beam. In the groove forming step ST2, the insulating layer 21a provided on one of the front face 10a and the rear face 10b of the core substrate 10 is sucked and held to a chuck table 41 having a holding face 41a formed form porous ceramics, etc. in a laser processing apparatus 40. Then, as depicted in FIG. 4, a laser beam L such as, for example, an excimer laser beam is irradiated from a laser beam irradiating unit 42 upon predetermined ranges of the insulating layer 21a in accordance with a predetermined pattern to form a plurality of grooves R on the surface 211a of the insulating layer 21a. By irradiating the laser beam L upon the predetermined range of the insulating layer 21a in this manner, a plurality of grooves R can be formed efficiently. Further, since laser beam machining is used, the plurality of grooves R can be formed at a low cost in comparison with an alternative case in which, for example, the insulating layers 21a are formed from resin material capable of being photo-etched to form the grooves R by photo-etching. Thereafter, the insulating layer 21a provided on the other one of the front face 10a and the rear face 10b of the core substrate 10 is sucked and held to the chuck table 41 (with the core substrate 10 turned over), and the laser beam L is similarly irradiated upon the surface 211a of the insulating layer 21a on the one face side to form a plurality of grooves R. As a result, the plurality of grooves R in which the wiring layers 21c are to be formed in a later step are formed on the surface of both of the insulating layers 21a provided on the front face 10a side and the rear face 10b side of the core substrate 10. It is to be noted that a protective member such as an adhesive tape may be stuck on the insulating layer 21a provided on the side that is to be sucked and held to the chuck table 41.

The seed layer forming step ST3 is a step of forming the metal seed layers S on the exposed faces (surfaces 211a) of the insulating layers 21a having the grooves R formed thereon in the groove forming step ST2. In the seed layer forming step ST3, seed layers S configured from conductive metal are successively coated by sputtering on both of the insulating layers 21 provided on the front face 10a side and the rear face 10b side of the core substrate 10. Consequently, the seed layers S are coated over the overall surfaces 211a of both of the insulating layers 21a on the front face 10a side and the rear face 10b side of the core substrate 10 including the inside of the plurality of grooves R as illustrated in FIG. 5. Thereupon, the seed layers S are formed also on the inner face of the through-holes not depicted for the through electrodes. As the seed layers S, solder material or the like formed from metal material may be formed on the surfaces 211a of the insulating layers 21a by screen printing or ink-jet printing.

The metal layer forming step ST4 is a step of electrodepositing the metal M on the seed layers S by plating to fill the grooves R with the metal M, from which the wiring layers 21c are to be formed, to form metal layers ML. In the metal layer forming step ST4, the seed layers S as electrodes in solution are used to electroplate the conductive metal M on the seed layers S on the surfaces 211a of the insulating layers 21a and the seed layer S on the internal face of the through-holes not depicted. As a result, the grooves R is filled with the metal M as depicted in FIG. 6. At the same time, also the through-holes not depicted for the through electrodes are filled with the metal M. In the metal layer forming step ST4, plating is performed successively or simultaneously for both of the insulating layers 21a on the front face 10a side and the rear face 10b side of the core substrate 10. Consequently, as depicted in FIG. 6, on both the front face 10a side and the rear face 10b side of the core substrate 10, the metal M is coated through the seed layers S on the surfaces 211a of the insulating layers 21a including the inside of the plurality of grooves R. In other words, the metal layers ML each formed from the seed layer S and the metal M are formed on the surfaces 211a of the insulating layers 21a. The metal M and the seed layers S in the plurality of grooves R form the wiring layers 21c of the first circuit pattern layers 21 by later steps.

The first removing step ST5 is a step of machining each metal layer ML by a cutting tool to remove the metal layer ML up to a position thereof not reaching a top 212a of the insulating layer 21a (not reaching the surface 211a of the insulating layer 21a at a portion other than the grooves R, refer to FIG. 8). In the first removing step ST5, as illustrated in FIG. 7, the surface of the metal M coated on the insulating layer 21a provided on one of the front face 10a and the rear face 10b of the core substrate 10 is sucked and held to a chuck table 32 having a holding face 32a formed from a metal pin chuck or the like of a machining apparatus 30. A cutting tool wheel 33 of the machining apparatus 30 is rotated while the cutting tool wheel 33 and the holding face 32a of the chuck table 32 are relatively moved in parallel directions to each other to machine the metal layer ML using a cutting tool 31. In the present embodiment, as illustrated in FIG. 8, only the metal M is machined by the cutting tool 31 such that the seed layer S and a small amount of the metal M are left on the top 212a of the insulating layer 21a. In other words, the insulating layer 21a is not machined by the cutting tool 31. However, in the first removing step ST5, as long as the insulating layer 21a is not machined by the cutting tool 31, the seed layer S and the metal M may be machined at the same time on the top 212a of the insulating layer 21a. Thereafter, the surface of the metal M coated on the insulating layer 21a provided on the other one of the front face 10a and the rear face 10b of the core substrate 10 is sucked and held to the chuck table 32 (with the core substrate 10 turned over). Then, the metal layer ML on the insulating layer 21a on the one face side is machined by the cutting tool 31 in a similar manner. It is to be noted that, also in the first removing step ST5, a protective member such as an adhesive tape may be stuck on the surface of the metal M coated on the insulating layer 21a provided on the side that is to be sucked and held to the chuck table 32.

The second removing step ST6 is a step of forming the wiring layers 21c of the circuit patterns 21b within the grooves R by exposing the top 212a of the insulating layers 21a by a CMP (Chemical Mechanical Polishing) process and flattening the exposed faces (the top 212a of the insulating layer 21a and the exposed faces 211b of the circuit patterns 21b (wiring layers 21c); refer to FIG. 10) after the first removing step ST5. In the second removing step ST6, as illustrated in FIG. 9, the surface of the metal M coated on the insulating layer 21a provided on one of the front face 10a and the rear face 10b of the core substrate 10 is sucked and held to a chuck table 61 having a holding face 61a formed from porous ceramics or the like in a CMP apparatus 60. While slurry is supplied from slurry supply means not depicted to the surface of the metal M and the chuck table 61 is rotated, a polishing wheel 62 is rotated to cause a polishing pad 63 attached to the tip of the polishing wheel 62 to polish the metal M and the seed layer S on the insulating layer 21a provided on the other face side as well as the top 212a of the insulating layer 21a provided on the other face side. Then, the surface of the metal M coated on the insulating layer 21a provided on the other face side of the front face 10a and the rear face 10b of the core substrate 10 is sucked and held to the chuck table 61 (with the core substrate 10 turned over). Then, the metal M and the seed layer S on the insulating layer 21a provided on the one face side as well as the top 212a of the insulating layer 21a provided on the one face side are polished in a similar manner by the polishing pad 63. Also, in the second removing step ST6, a protective member such as an adhesive tape may be stuck on the surface of the metal M coated on the insulating layer 21a provided on the side that is to be sucked and held to the chuck table 61.

Consequently, as illustrated in FIG. 10, the metal M and the seed layers S left on the top 212a of the insulating layers 21a are removed to expose the top 212a of the insulating layers 21a. As a result, the metal M and the seed layers S that remain within the grooves R form the wiring layers 21c (circuit patterns 21b) embedded in the insulating layers 21a, and are exposed to the surfaces 211a of the insulating layers 21a. The wiring layers 21c configure a plurality of circuit patterns 21b in the first circuit pattern layers 21. Further, the metal M and the seed layer S that remain in the through-holes not depicted for the through electrodes form circuit patterns for the through electrodes and are exposed to the surfaces 211a of the insulating layers 21a. Further, since a CMP process is used to polish the top 212a of the insulating layer 21a and the exposed faces 211b (surfaces of the metal M in the grooves R) of the circuit patterns 21b (wiring layers 21c) using the polishing pad 63, the top 212a of the insulating layer 21a and the exposed faces 211b of the circuit patterns 21b (wiring layers 21c) are flattened. As a result, flattening of the first circuit pattern layers 21 can be achieved as illustrated in FIG. 10.

After the first circuit pattern layers 21 are formed through the procedure described above, the processes from the insulating layer forming step ST1 up to the second removing step ST6 are repeatedly performed. In particular, after the second removing step ST6, each of the insulating layers 22a is formed by fixing the ABF on the flattened circuit pattern 21b (wiring layer 21c) and the insulating layer 21a of the first circuit pattern layer 21 (insulating layer forming step ST1). Then, a plurality of grooves R are formed on the insulating layers 22a using the laser processing apparatus 40 (groove forming step ST2). Then, metal seed layers S are formed on the insulating layers 22a by sputtering or the like (seed layer forming step ST3) and, using the seed layers S as electrodes, metal M is coated on the insulating layers 22a by electrolytic plating to form metal layers ML (metal layer forming step ST4). Further, each of the metal layers ML is machined by a cutting tool to remove the metal layer ML up to a position thereof not reaching the top of the insulating layers 22a (first removing step ST5), whereafter a CMP process is performed to expose the top of the insulating layers 22a thereby to form the wiring layers 22c of the circuit patterns 22b and flatten the exposed faces (second removing step ST6). This processing permits the second circuit pattern layers 22 to be formed on the first circuit pattern layers 21. The third circuit pattern layers 23 can be formed on the second circuit pattern layers 22 by a similar procedure. As a result, the wiring board 1 having the circuit pattern layers 20 depicted in FIG. 1 can be formed. Further, since the first circuit pattern layers 21, second circuit pattern layers 22 and third circuit pattern layers 23 are flattened, flattening of the entire wiring board 1 can be achieved. Accordingly, flatness required for the wiring board 1 as an interposer can be secured.

Further, when the circuit patterns of the different circuit pattern layers 20 are to be electrically connected to each other including a case in which the circuit patterns for the through electrode not depicted are to be connected to each other, in the processing procedure illustrated in FIG. 2, grooves R reaching a position at which the circuit patterns on the lower layer side are exposed to the insulating layers are formed by the groove forming step ST2. Consequently, the seed layers S are formed on the exposed faces of the circuit patterns provided on the lower layer side in the seed layer forming step ST3, and the grooves R are filled with the metal M in the metal layer forming step ST4. Then, by the first removing step ST5 and the second removing step ST6, the circuit patterns connected to the circuit patterns on the lower layer side can be formed. In the outermost layers of the wiring board 1, only electrode pad portions of the circuit patterns are exposed to the surfaces. The electrode pad portion is a portion for electrically connecting the wiring board 1 to a semiconductor chip mounted on the wiring board 1 or a different wiring board connected to the wiring board 1.

As described above, in the manufacturing method for a wiring board according to the first embodiment, each circuit pattern 21b (wiring layer 21c) is exposed to the surface 211a of the insulating layer 21a without machining the insulating layer 21a by the cutting tool 31. In other words, the metal M and the metal seed layer S are not machined together with the insulating layer 21a. Consequently, such a situation can be suppressed well that the exposed face 211b suffers from occurrence of roughness (smear) in that the metal M and the metal seed layers S are machined together with the insulating layer 21a by the cutting tool 31 to form, for example, on the exposed face 211b of the circuit patterns 21b (wiring layers 21c), a portion 212b (refer to FIG. 11) of the metal M extending in the machining direction or that the exposed face 211b is damaged. Accordingly, with the manufacturing method for a wiring board according to the first embodiment, roughness can be suppressed from occurring on the circuit patterns 21b (wiring layers 21c) of the wiring board 1, and the circuit patterns 21b (wiring layers 21c) of the wiring board 1 can be formed in accordance with its design.

The manufacturing method for a wiring board according to the first embodiment includes flattening the top 212a of the insulating layer 21a and the exposed face 211b of the circuit pattern 21b (wiring layer 21c) in the second removing step ST6. Consequently, even if the core substrate 10 itself is warped like the core substrate 10 in the present embodiment, or even if the front face 10a or the rear face 10b of the core substrate 10 is uneven, flattening of the first circuit pattern layer 21 can be achieved, and consequently, the wiring board 1 can be flattened.

Further, with the manufacturing method for a wiring board according to the first embodiment, since the insulating layer 21a formed from the ABF containing silica filler is not machined by the cutting tool 31, abrasion or chipping can be suppressed from occurring with the cutting tool 31.

In the manufacturing method for a wiring board according to the first embodiment, the second removing step ST6 may include etching to expose the top 212a of the insulating layer 21a thereby to form the wiring layer 21c of the circuit pattern 21b and flatten the exposed faces (top 212a of the insulating layer 21a and exposed face 211b of the circuit pattern 21b (wiring layer 21c)). For example, when wet etching is used in the second removing step ST6, after the first removing step ST5, the core substrate 10 is immersed in a chemical solution vessel that is filled with chemical solution (etching solution) that can dissolve the metal M, seed layers S, and insulating layers 21a. It is to be noted that, in the wet etching, the chemical solution (etching solution), which can dissolve the metal M, seed layers S, and insulating layers 21a, may be supplied to the core substrate 10 by spin coating or the like.

Consequently, the metal M and the seed layers S remaining on the top 212a of the insulating layers 21a are removed and the top 212a of the insulating layers 21a is exposed as depicted in FIG. 10. Since only the seed layers S and a small amount of the metal M remain on the top 212a of the insulating layers 21a after the first removing step ST5, the metal M and the seed layers S can be easily removed except for the inside of the grooves R by wet etching. Further, the metal M and the seed layers S that remain within the plurality of grooves R form the wiring layers 21c (circuit patterns 21b) that are embedded in the insulating layers 21a and are exposed on the surfaces 211a of the insulating layers 21a. In particular, the circuit patterns 21b (wiring layers 21c) can be exposed on the surfaces 211a of the insulating layers 21a without machining the insulating layers 21a by the cutting tool 31. As a result, such a situation can be suppressed well that the exposed face 211b suffers from occurrence of roughness (smear) in that the metal M and the metal seed layers S are machined together with the insulating layer 21a by the cutting tool 31 to form, for example, on the exposed faces 211b of the circuit patterns 21b (wiring layers 21c), a portion 212b (refer to FIG. 11) of the metal M extending in the machining direction or that the exposed face 211b is damaged. Accordingly, the circuit patterns 21b (wiring layers 21c) can be formed in accordance with their design.

Further, as regards the wet etching, a kind of chemical solution (etching solution) or a processing time period for the etching is suitably selected and adjusted such that the top 212a of the insulating layer 21a and the exposed faces 211b of the circuit patterns 21b (wiring layers 21c) are flattened as far as possible. Consequently, flattening of the first circuit pattern layer 21 can be achieved to secure flatness required for the wiring board 1 as an interposer. It is to be noted that the second removing step ST6 may perform dry etching to expose the top 212a of the insulating layers 21a to expose the circuit patterns 21b (wiring layers 21c) and flatten the exposed faces 211b.

Second Embodiment

Figure 11:
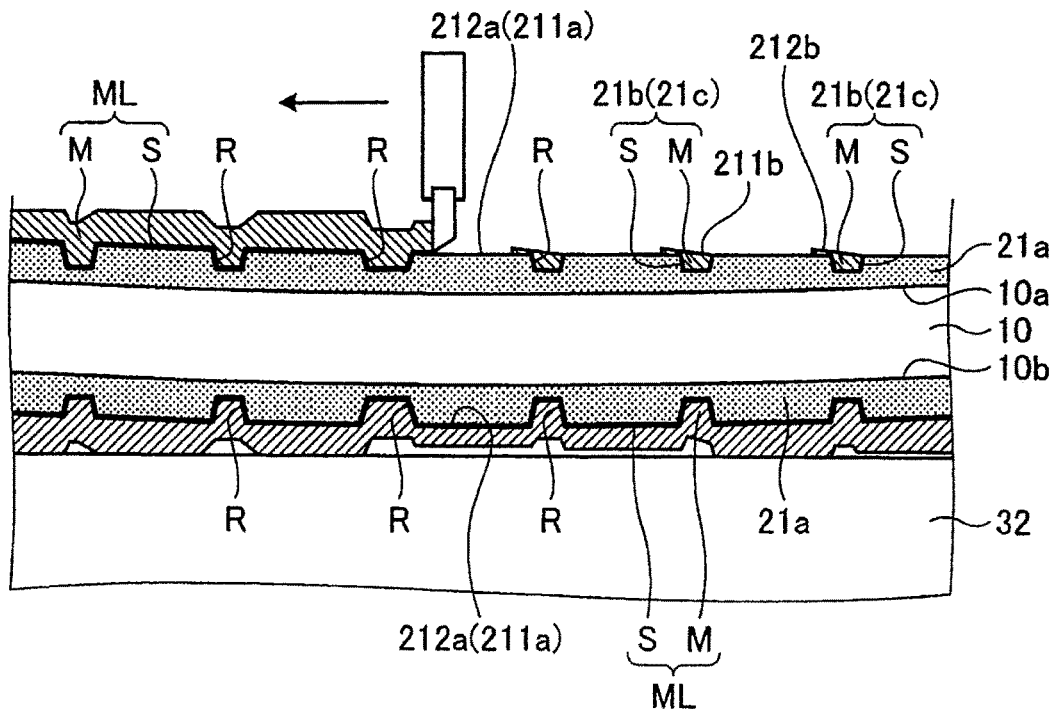
FIG. 11 is a schematic view illustrating a manner in which a first removing step is performed in a manufacturing method for a wiring board according to a second embodiment.
Figure 12:
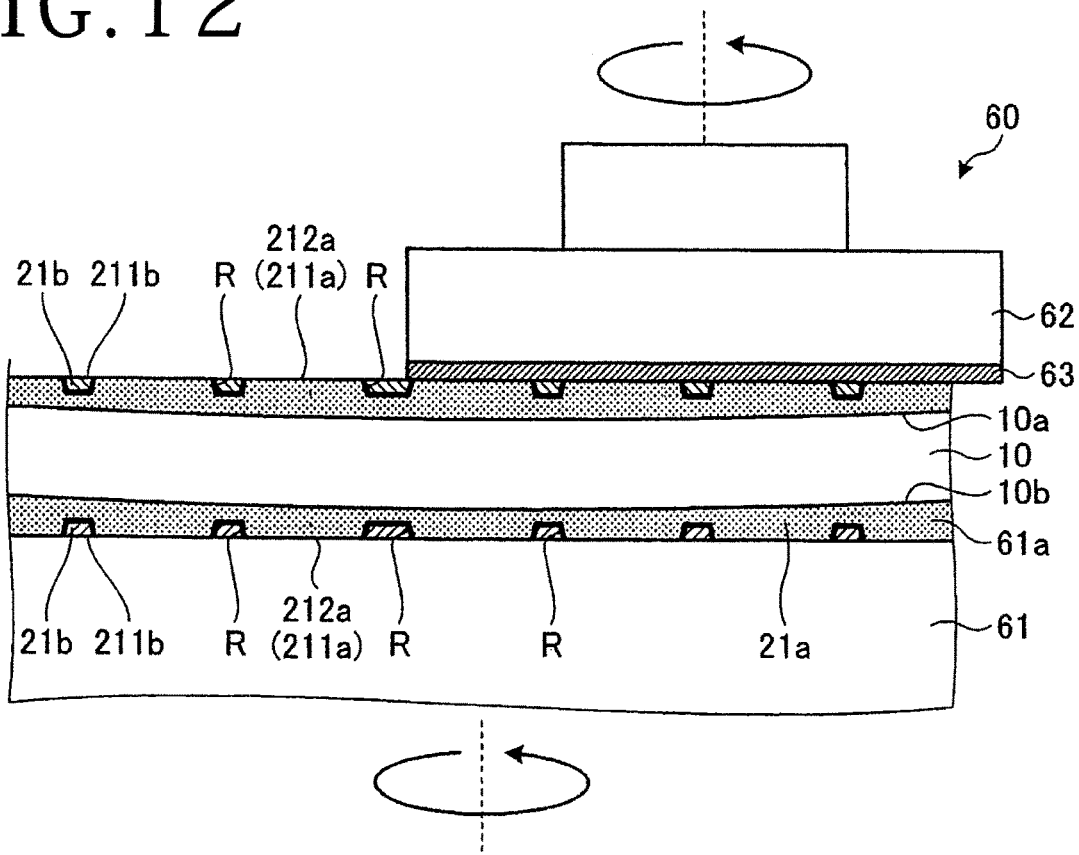
FIG. 12 is a schematic view illustrating a manner in which a second removing step is carried out in the manufacturing method for a wiring board according to the second embodiment.

Subsequently, a manufacturing method for a wiring board according to a second embodiment of the present invention is described. The manufacturing method for a wiring board according to the second embodiment is similar to the manufacturing method for a wiring board according to the first embodiment except that it is different in techniques in the first removing step ST5 and the second removing step ST6 illustrated in FIG. 2. In the following, the first removing step ST5 and the second removing step ST6 in the second embodiment are described with reference to the drawings, and description of the steps other than the first removing step ST5 and the second removing step ST6 is omitted herein. FIG. 11 is a schematic view illustrating a manner in which the first removing step ST5 in the manufacturing method for a wiring board according to the second embodiment is carried out, and FIG. 12 is a schematic view illustrating a manner in which the second removing step ST6 in the manufacturing method for a wiring board according to the second embodiment is carried out.

In the second embodiment, the first removing step ST5 is a step of machining each metal layer ML by a cutting tool to remove the metal layer ML up to a position reaching the top 212a of the insulating layer 21a. In the first removing step ST5 according to the second embodiment, the surface of the metal M coated on the insulating layer 21a provided on one of the front face 10a and the rear face 10b of the core substrate 10 is sucked and held to the chuck table 32 having the holding face 32a formed from a metal pin chuck or the like of the machining apparatus 30 as depicted in FIG. 11. Then, while the cutting tool wheel 33 of the machining apparatus 30 is rotated and the cutting tool wheel 33 and the holding face 32a of the chuck table 32 are relatively moved in parallel to each other, the metal M and the seed layer S including a surface layer portion of the insulating layer 21a are machined flat by the cutting tool 31. Then, the surface of the metal M coated on the insulating layer 21a provided on the other one of the front face 10a and the rear face 10b of the core substrate 10 is sucked and held to the chuck table 32 (with the core substrate 10 turned over). Then, the metal M and the seed layer S on the insulating layer 21a provided on the one face side of the core substrate 10 are machined by the cutting tool 31 in a similar manner. It is to be noted that, in the first removing step ST5 according to the second embodiment, a protective member such as an adhesive tape may be stuck on the surface of the metal M coated on the insulating layer 21a provided on the side that is sucked and held on the chuck table 32.

By the processing described above, the metal M and the seed layers S remaining on the top 212a of the insulating layers 21a are removed thereby to expose the top 212a of the insulating layers 21a. As a result, the metal M and the seed layer S that remain in the grooves R form the wiring layers 21c (circuit patterns 21b) embedded in the insulating layers 21a and are exposed to the surfaces 211a of the insulating layers 21a. The wiring layers 21c configure the plurality of circuit patterns 21b in the first circuit pattern layers 21. Further, the metal M and the seed layer S that remain in the through-holes not depicted for the through electrodes form circuit patterns for the through electrodes and are exposed on the surfaces 211a of the insulating layers 21a. Thereupon, since the metal M and the seed layers S are machined along with surface layer portions of the insulating layers 21a formed from the ABF containing silica filler by the cutting tool 31, roughness (smear) occurs on the exposed faces 211b of the circuit patterns 21b (wiring layers 21c). For example, portions 212b of the metal M which extend in the machining direction may be formed on the exposed faces 211b of the circuit patterns 21b (wiring layers 21c) as depicted in FIG. 11, or the exposed faces 211b may be damaged.

In the second embodiment, the second removing step ST6 is a step of flattening, after the first removing step ST5, the exposed faces on which the circuit patterns 21b (wiring layers 21c) are exposed by the CMP process (flattening the top 212a of the insulating layer 21a and the exposed faces 211b of the circuit patterns 21b (wiring layers 21c)). In the second removing step ST6, the insulating layer 21a provided on one of the front face 10a and the rear face 10b of the core substrate 10 is sucked and held to the chuck table 61 having the holding face 61a formed from porous ceramics or the like in the CMP apparatus 60 as depicted in FIG. 12. Then, while slurry is supplied from the slurry supply means not depicted to the insulating layer 21a and the chuck table 61 is rotated, the polishing wheel 62 is rotated to cause the polishing pad 63 attached to the tip of the polishing wheel 62 to polish and flatten the top 212a of the insulating layer 21a and the exposed faces 211b of the circuit patterns 21b (wiring layers 21c) provided on the other face side of the core substrate 10. Then, the insulating layer 21a on the other one of the front face 10a and the rear face 10b of the core substrate 10 is sucked and held to the chuck table 61 (with the core substrate 10 turned over). Then, the top 212a of the insulating layer 21a and the exposed faces 211b of the circuit patterns 21b (wiring layers 21c) on the one face side of the core substrate 10 are polished and flattened in a similar manner by the polishing pad 63. By the flattening, roughness (smear) occurring on the exposed faces of the circuit patterns 21b (wiring layers 21c) can be removed. Further, by flattening the top 212a of the insulating layer 21a and the exposed faces 211b of the circuit patterns 21b (wiring layers 21c), flattening of the first circuit pattern layers 21 can be achieved. It is to be noted that, also in the second removing step ST6 according to the second embodiment, a protective member such as an adhesive tape may be stuck on the insulating layer 21a on the side that is sucked and held to the chuck table 61.

Also in the second embodiment, after the first circuit pattern layers 21 are formed by the procedure described above, the processes from the insulating layer forming step ST1 to the second removing step ST6 are repeatedly carried out, and by the processes, the second circuit pattern layers 22 can be formed on the first circuit pattern layers 21. Further, the third circuit pattern layers 23 can be formed on the second circuit pattern layers 22 by a similar procedure. As a result, the wiring board 1 having the circuit pattern layers 20 depicted in FIG. 1 can be formed. Further, by flattening the first circuit pattern layers 21, second circuit pattern layers 22 and third circuit pattern layers 23, flattening of the entire wiring board 1 can be achieved.

As described above, with the manufacturing method for a wiring board according to the second embodiment, roughness (smear) occurring on the exposed faces 211b of the circuit patterns 21b (wiring layers 21c) since the metal M and the seed layers S are machined together with surface layer portions of the insulating layers 21a formed from the ABF containing silica filler can be removed in the second removing step ST6. Accordingly, with the manufacturing method for a wiring board according to the second embodiment, roughness can be prevented from occurring on the circuit patterns 21b (wiring layers 21c), and the circuit patterns 21b (wiring layers 21c) can be formed in accordance with its design.

The manufacturing method for a wiring board according to the second embodiment flattens the top 212a of the insulating layer 21a and the exposed faces 211b of the circuit patterns 21b (wiring layers 21c) in the second removing step ST6. Consequently, even if the core substrate 10 itself is warped like the core substrate 10 in the present embodiment or the front face 10a or the rear face 10b of the core substrate 10 is uneven, flattening of the first circuit pattern layers 21 can be achieved.

In the second embodiment, the second removing step ST6 may flatten, after the first removing step ST5, the exposed faces on which the circuit patterns 21b (wiring layers 21c) are exposed by etching (flatten the top 212a of the insulating layer 21a and the exposed faces 211b of the circuit patterns 21b (wiring layers 21c)). For example, where wet etching is used as the second removing step ST6, after the first removing step ST5, the core substrate 10 is immersed in a chemical solution vessel that is filled with chemical solution (etching solution) that can dissolve the metal M, seed layers S and insulating layers 21a. In the wet etching, the chemical solution (etching solution) that can dissolve the metal M, seed layers S and insulating layers 21a may be supplied to the core substrate 10 by spin coating or the like. This makes it possible to flatten the exposed faces 211b of the circuit patterns 21b (wiring layers 21c) using chemical solution to remove roughness (smear) occurring on the exposed faces 211b. Accordingly, it is possible to suppress occurrence of roughness (smear) on the circuit patterns 21b (wiring layers 21c) and form the circuit patterns 21b (wiring layers 21c) in accordance with the design.

Further, upon wet etching, a kind of chemical solution (etching solution) or a processing time period of etching is selected and adjusted suitably to flatten the top 212a of the insulating layer 21a and the exposed faces 211b of the circuit patterns 21b (wiring layers 21c) as far as possible. This makes it possible to achieve flattening of the first circuit pattern layers 21 to secure flatness required for the wiring board 1 as an interposer. It is to be noted that the second removing step ST6 of the second embodiment may otherwise flatten the exposed faces on which the circuit patterns 21b (wiring layers 21c) are exposed by dry etching.

Although, in the manufacturing methods for a wiring board according to the first and second embodiments, a circuit pattern layer 20 is formed on both the front face 10a and the rear face 10b of the core substrate 10, the present invention can be applied also to a wiring board in which a circuit pattern layer 20 is formed on only one of the faces of the core substrate 10.

The manufacturing methods for a wiring board according to the first and second embodiments repeat, after the second removing step ST6, the insulating layer formation step ST1 of forming an insulating layer on the flattened circuit pattern, groove forming step ST2, seed layer forming step ST3, metal layer forming step ST4, first removing step ST5 and second removing step ST6 to stack circuit patterns. In particular, the processing procedure illustrated in FIG. 2 is repeatedly performed to stack and form the second circuit pattern layers 22 on the first circuit pattern layers 21 and stack and form the third circuit pattern layers 23 on the second circuit pattern layers 22. Consequently, it is possible to suppress roughness from occurring not only on the circuit patterns 21b (wiring layers 21c) of the first circuit pattern layers 21 but also on the circuit patterns 22b (wiring layers 22c) of the second circuit pattern layers 22 and the circuit patterns 23b (wiring layers 23c) of the third circuit pattern layers 23, and consequently, all of the circuit patterns 21b, 22b and 23b (wiring layers 21c, 22c and 23c) can be formed in accordance with their design.

While flattening of the layers is achieved, by stacking the first circuit pattern layers 21, second circuit pattern layers 22 and third circuit pattern layers 23, the flatness can be favorably prevented from deteriorating every time each layer is stacked. Accordingly, it is possible to favorably secure the flatness of the third circuit pattern layers 23 located at the outermost layers to achieve more favorable connection between the electrodes of the wiring board 1 and electrodes of parts mounted on the wiring board 1. Further, by flattening the surface of the circuit patterns 21b, 22b and 23b (wiring layers 21c, 22c and 23c), the interlayer distance (electrode height) of the circuit patterns 21b, 22b and 23b (wiring layers 21c, 22c and 23c) can be made fixed. As a result, the value of the resistance or the communication speed in each of the circuit patterns 21b, 22b, and 23b (wiring layers 21c, 22c, and 23c) can be made fixed.

Figure 13:
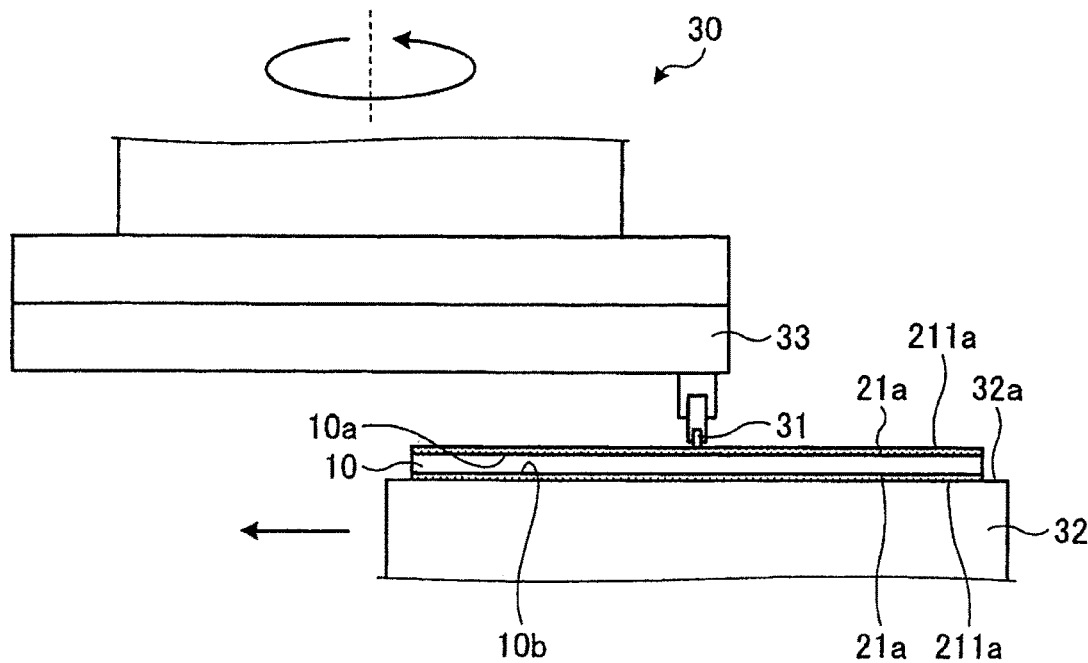
FIG. 13 is a schematic view illustrating a manner in which a flattening step is carried out.
Figure 14:
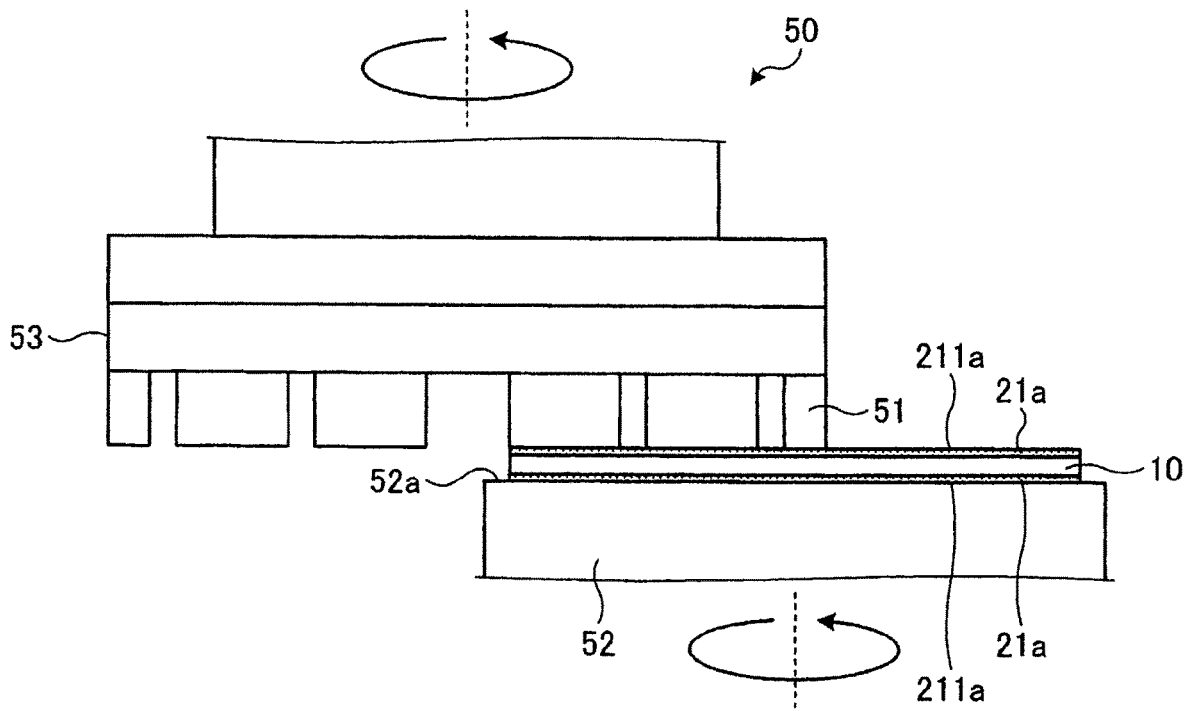
FIG. 14 is a schematic view illustrating another manner in which the flattening step is carried out.
Figure 15:
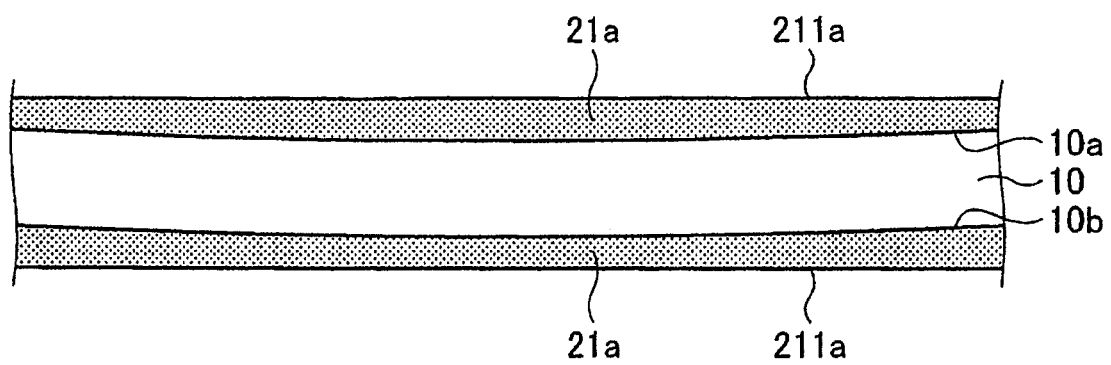
FIG. 15 is a schematic view depicting the core substrate on which the insulating layer is flattened by the flattening step.

Further, in the manufacturing methods for a wiring board according to the first and second embodiments, a flattening step of flattening the surfaces 211a of the insulating layers 21a by the cutting tool 31 or a grinding stone 51 may be carried out after the insulating layer formation step ST1 is carried out but before the groove forming step ST2 is carried out. FIGS. 13 and 14 are schematic views illustrating a manner in which the flattening step is carried out. FIG. 15 is a schematic view depicting the core substrate 10 in which the insulating layers 21a are flattened by the flattening step.

In the flattening step, the insulating layer 21a on one of the front face 10a and the rear face 10b of the core substrate 10 is sucked and held to the chuck table 32 having the holding face 32a formed from a metal pin chuck or the like of the machining apparatus 30 as depicted in FIG. 13. Then, while the cutting tool wheel 33 of the machining apparatus 30 is rotated and the cutting tool wheel 33 and the holding face 32a of the chuck table 32 are relatively moved in parallel to each other, the surface 211a of the insulating layer 21a is machined flat by the cutting tool 31. Then, the insulating layer 21a on the other one of the front face 10a and the rear face 10b of the core substrate 10 is sucked and held to the chuck table 32 (with the core substrate 10 turned over), and the surface 211a of the insulating layer 21a on the one face side of the core substrate 10 is machined flat in a similar manner by the cutting tool 31. It is to be noted that a protective member such as an adhesive tape may be stuck on the insulating layer 21a on the side that is sucked and held on the chuck table 32.

Consequently, the surfaces 211a of both of the insulating layers 21a on the front face 10a side and the rear face 10b side of the core substrate 10 can be formed flat in advance as illustrated in FIG. 15 before the steps beginning with the groove forming step ST2 are carried out. As a result, even if the core substrate 10 itself is warped or the front face 10a or the rear face 10b of the core substrate 10 is uneven, the surfaces 211a of the insulating layers 21a that later serve as the first circuit pattern layers 21 can be flattened. Accordingly, the wiring board 1 can be flattened further.

While, in the example illustrated in FIG. 13, the surfaces 211a of the insulating layers 21a are machined flat by the cutting tool 31 of the machining apparatus 30, the flattening step may otherwise flatten the surfaces 211a of the insulating layers 21a by the grinding stone 51 of a grinding apparatus 50 as depicted in FIG. 14. When the surfaces 211a of the insulating layers 21a are machined flat by the grinding stone 51 of the grinding apparatus 50, an insulating layer 21a is sucked and held to a chuck table 52 having a holding face 52a of the grinding apparatus 50. Then, while the chuck table 52 is rotated in a state in which the grinding stone 51 of the grinding apparatus 50 contacts with the insulating layers 21a, a grinding wheel 53 is rotated to machine and flatten the surface 211a of the insulating layer 21a by the grinding stone 51. It is to be noted that a protective member such as an adhesive tape may be stuck on the insulating layer 21a on the side that is sucked and held to the chuck table 52. Consequently, the surfaces 211a of both of the insulating layers 21a provided on the front face 10a side and the rear face 10b side of the core substrate 10 can be formed flat in advance before the steps beginning with the groove forming step ST2 are carried out as depicted in FIG. 15. It is to be noted that, also when the second circuit pattern layers 22 and the third circuit pattern layers 23 are formed, the flattening step illustrated in FIG. 13 or 14 may be carried out before the groove forming step ST2 is carried out after the insulating layer formation step ST1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method for a wiring board that includes a rewiring layer on a surface thereof, comprising:
   an insulating layer forming step of forming an insulating layer on a core substrate;
   a groove forming step of forming a groove in which a wiring layer of a circuit pattern is to be provided on the insulating layer;
   a seed layer forming step of forming a metal seed layer on an exposed face of the insulating layer on which the groove is formed in the groove forming step;
   a metal layer forming step of electrodepositing metal, which is to form the wiring layer, by a plating process to fill the groove with the metal to form a metal layer on the seed layer;
   a first removing step of machining the metal layer by a single point cutting tool to remove a portion of the metal layer up to a position not reaching a top of the insulating layer, a remainder of the metal layer covering the insulating layer and the filled grooves; and
   a second removing step of performing, after the first removing step, etching or a chemical mechanical polishing process to remove the remainder of the metal layer and to expose the top of the insulating layer thereby to form the wiring layer in the groove and flatten an exposed face of the wiring layer;
   wherein after the second removing step, the insulating layer forming step of forming an insulating layer on the flattened wiring layer, the groove forming step, the seed layer forming step, the metal layer forming step, the first removing step, and the second removing step are repeated to stack circuit patterns.

2. A manufacturing method for a wiring board that includes a rewiring layer on a surface thereof, comprising:
   an insulating layer forming step of forming an insulating layer on a core substrate;
   a groove forming step of forming a groove in which a wiring layer of a circuit pattern is to be provided on the insulating layer;
   a seed layer forming step of forming a metal seed layer on an exposed face of the insulating layer on which the groove is formed in the groove forming step;
   a metal layer forming step of electrodepositing metal, which is to form the wiring layer, by a plating process to fill the groove with the metal to form a metal layer on the seed layer;
   a first removing step of machining the metal layer by a single point cutting tool to remove the metal layer, the seed layer, and a surface layer portion of the insulating layer to form the wiring layer in the groove; and
   a second removing step of performing, after the first removing step, etching or a chemical mechanical polishing process to flatten an exposed face of the wiring layer and remove roughness on the exposed face of the wiring layer;
   wherein after the second removing step, the insulating layer forming step of forming an insulating layer on the flattened wiring layer, the groove forming step, the seed layer forming step, the metal layer forming step, the first removing step, and the second removing step are repeated to stack circuit patterns.

* * * * *